(12) United States Patent
Robinson

(10) Patent No.: US 6,696,848 B2
(45) Date of Patent: Feb. 24, 2004

(54) LOAD BOARD SOCKET ADAPTER AND INTERFACE METHOD

(75) Inventor: Keith Robinson, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/183,237

(22) Filed: Jun. 26, 2002

(65) Prior Publication Data
US 2003/0001601 A1 Jan. 2, 2003

Related U.S. Application Data

(63) Continuation of application No. 08/963,379, filed on Nov. 3, 1997, now Pat. No. 6,437,586.

(51) Int. Cl.$^7$ .............................................. G01R 31/02
(52) U.S. Cl. ....................................................... 324/755
(58) Field of Search ................................. 324/754, 755, 324/757, 758, 765

(56) References Cited

U.S. PATENT DOCUMENTS

| | | |
|---|---|---|
| 4,145,620 A | 3/1979 | Dice |
| 4,922,191 A | 5/1990 | Conover |
| 5,387,861 A | 2/1995 | Neiderhofer |
| 5,415,560 A | 5/1995 | Balyasny |
| 5,594,356 A | 1/1997 | Turner et al. |
| 5,847,572 A * | 12/1998 | Iwasaki et al. ............. 324/755 |
| 5,885,109 A | 3/1999 | Lee et al. |
| 5,990,692 A * | 11/1999 | Jeong et al. ................ 324/755 |

* cited by examiner

Primary Examiner—Kamand Cuneo
Assistant Examiner—Russell M. Kobert
(74) Attorney, Agent, or Firm—Perkins Coie LLP

(57) ABSTRACT

A load board adapter which is removably attachable to a load board and provides removable and replaceable sockets for individual integrated circuit packages to provide an electrical connection between the integrated circuits and the circuit tester to facilitate testing of relatively small quantities of electronic devices on high volume testers. The chip sockets can be configured to hold a variety of devices such as a DIP, an SOJ, a TSOP, a ZIF, a PLCC, etc. A first set of contacts are clamped to a main adapter base which is removably securable to a load board or similar test fixture. Each contact within the first set of contacts includes a load board engagement portion which is configured to frictionally engage pad sites on the test fixture. A second portion of each contact within the first set of contacts is configured to engage an individual contact within a second set of contacts. The second contacts are electrically connected to pin receptacles on a substrate such as a printed circuit board. The pin receptacles are arranged for removable reception of a socket.

14 Claims, 4 Drawing Sheets

LOAD BOARD SOCKET ADAPTER AND INTERFACE METHOD

CROSS REFERENCE TO RELATED APPLICATION

This application is a continuation of U.S. patent application Ser. No. 08/963,379, filed on Nov. 3, 1997, now U.S. Pat. No. 6,437,586 the teachings of which are incorporated herein by reference.

BACKGROUND OF THE INVENTION

1. Technical Field

This invention generally relates to systems for testing electronic circuits by applying and/or measuring electrical signals. More particularly, this invention relates to electronic circuit test systems for applying electrical signals to a packaged device or integrated circuit being tested and measuring the response of the device or integrated circuit to the applied electrical signals. Specifically, one embodiment of the invention provides a replaceable socket for effecting an electrical connection in an electronic circuit tester between an electronic circuit, such as a packaged device or integrated circuit, and a fixture board of the tester so that electrical signals can be transmitted to and/or received from the electronic circuit for characterizing the performance of the electronic circuit.

2. Background Art

Programmable electronic circuit testers are used during the manufacture of integrated circuits to test the performance of the device. Tests are conducted to assure that the device satisfies performance specifications and to classify the devices by performance characteristics. In order to test the device or integrated circuit, the electronic circuit tester is programmed to apply one or more electrical signals to various pins or contacts on the device and to measure the response(s).

A conventional programmable electronic circuit tester, generally indicated by the numeral 10, is shown in FIG. 1. The electronic circuit tester 10 comprises a test head 12 electrically connected by cables routed through to electronic test and measurement instruments, such as advanced computerized signal processing equipment, for applying electrical signals and measuring the response(s) to those applied electrical signals. The test head 12 can include circuitry which performs distribution of electrical signals, signal separation, frequency translation, amplification, attenuation, switching, or other conditioning or modification of electrical signals prior to being routed to a device being tested.

As shown in FIG. 1, test head 12 interfaces to a device or integrated circuit through a load board 14 mounted to the test head. The configuration of the load board 14 depends on the type or family of device or integrated circuit being tested, such as an analog or digital electronic circuit.

A socket 20 through which an integrated circuit 22 is electrically connected to the electronic circuit tester 10 is subjected to many connections and disconnections during actual testing with the tester. However, the useful life of the electronic circuit tester 10 has heretofore far exceeded the useful life of socket 22. Also, the repeatability and accuracy of the connections that are effected by socket 20 with integrated circuit 22 decreases over time as the socket degrades due to wear. Additionally, because of the specialized nature of most limited run parts, a new interface or adapter must be installed for each part type to be tested.

A single load board for a particular testing application can cost as much as ten to twenty thousand dollars. Obviously, this expense is not justified for low quantity testing as is oftentimes necessary during the engineering and prototype and limited run production phases of most electronic devices. In these particular circumstances, tests have been done by hand which is extremely time consuming and oftentimes not as accurate.

What is needed is a flexible interface between integrated circuits and the circuit tester to facilitate testing of relatively small quantities of electronic devices on high volume testers.

DISCLOSURE OF THE INVENTION

One embodiment of the invention contemplates a load board adapter which is removably attachable to a load board and provides removable and replaceable sockets for individual integrated circuit packages to provide an electrical connection between the integrated circuits and the circuit tester. This particular embodiment of the invention utilizes a first set of contacts, one side of which interfaces with the load board or similar test fixture, and a second set of contacts interfacing with the first set of contacts. The second set of contacts are electrically connected to pin receptacles secured to a printed circuit board which receive a removable chip socket. The chip sockets can be configured to hold a variety of devices such as a dual in line package (DIP), a small outline J-leaded package (SOJ), a thin small outline package (TSOP), a zero insert force package (ZIF), a plastic leaded chip carrier (PLCC), etc. The first set of contacts are clamped to the main adapter base which is removably secured to the load board. Each contact within the first set of contacts includes a load board engagement portion which is configured to frictionally engage pad sites on the load board. A second portion of each contact within the first set of contacts is configured to engage an individual contact within the second set of contacts.

The second contacts are each electrically connected to separate pin receptacles on a substrate such as a printed circuit board. The pin receptacles are arranged for removable reception of a socket. The first set of contacts may be advantageously configured to force frictional engagement with their respective engagement elements via a spring biased arrangement, as will become evident in the following detailed description.

Employing the first and second contacts along with removable and replaceable sockets provides the flexibility of being able to not only replace damaged sockets with an identical new socket, but also allows entire socket and printed circuit board subassemblies to be changed on any particular adapter base and thereby accept different electrical components for testing using the same adapter base and load board.

DETAILED DESCRIPTION OF THE INVENTION

Figure 1:
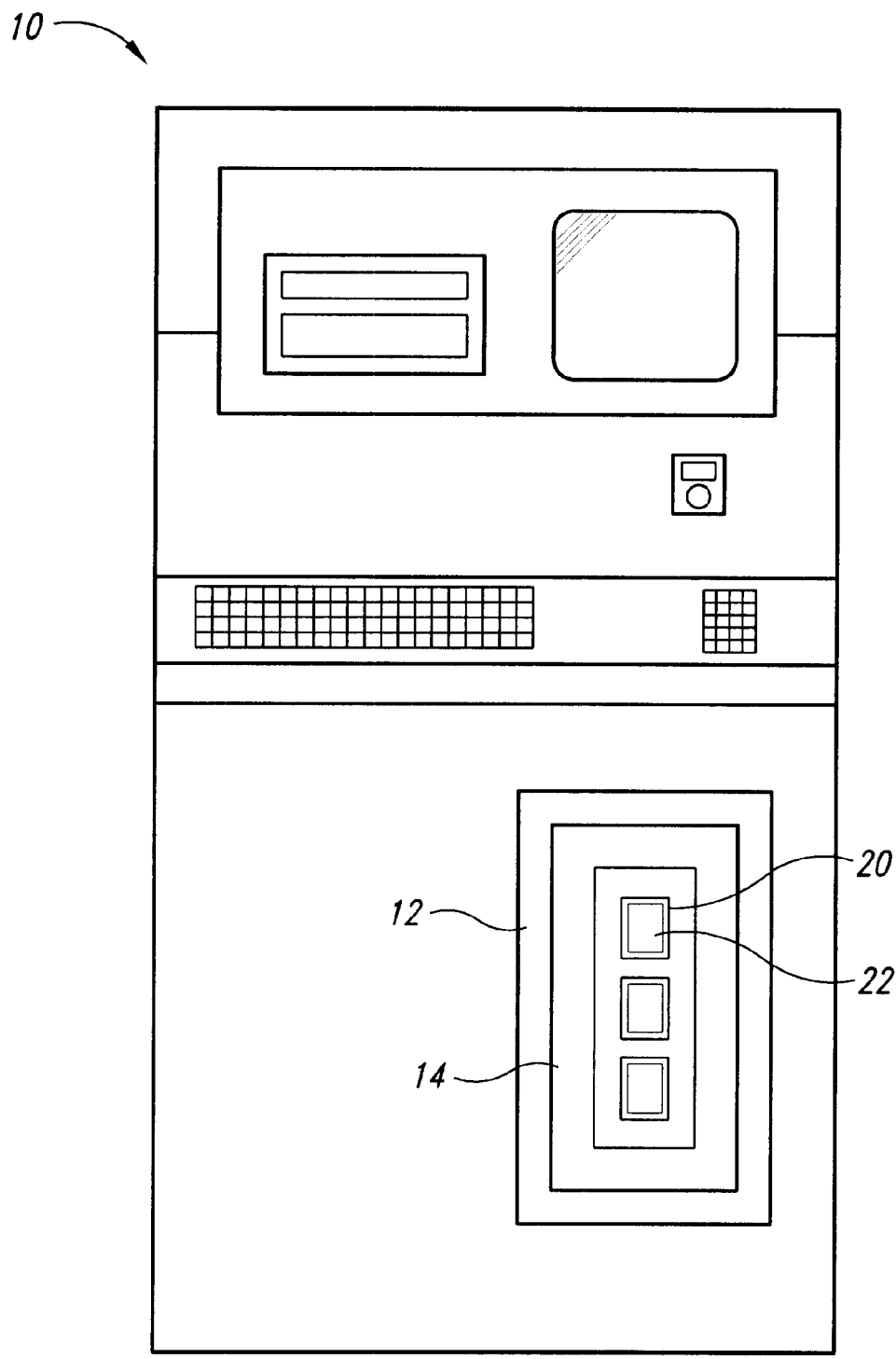
FIG. 1 is a representational view of an electronic circuit testing apparatus.
Figure 2:
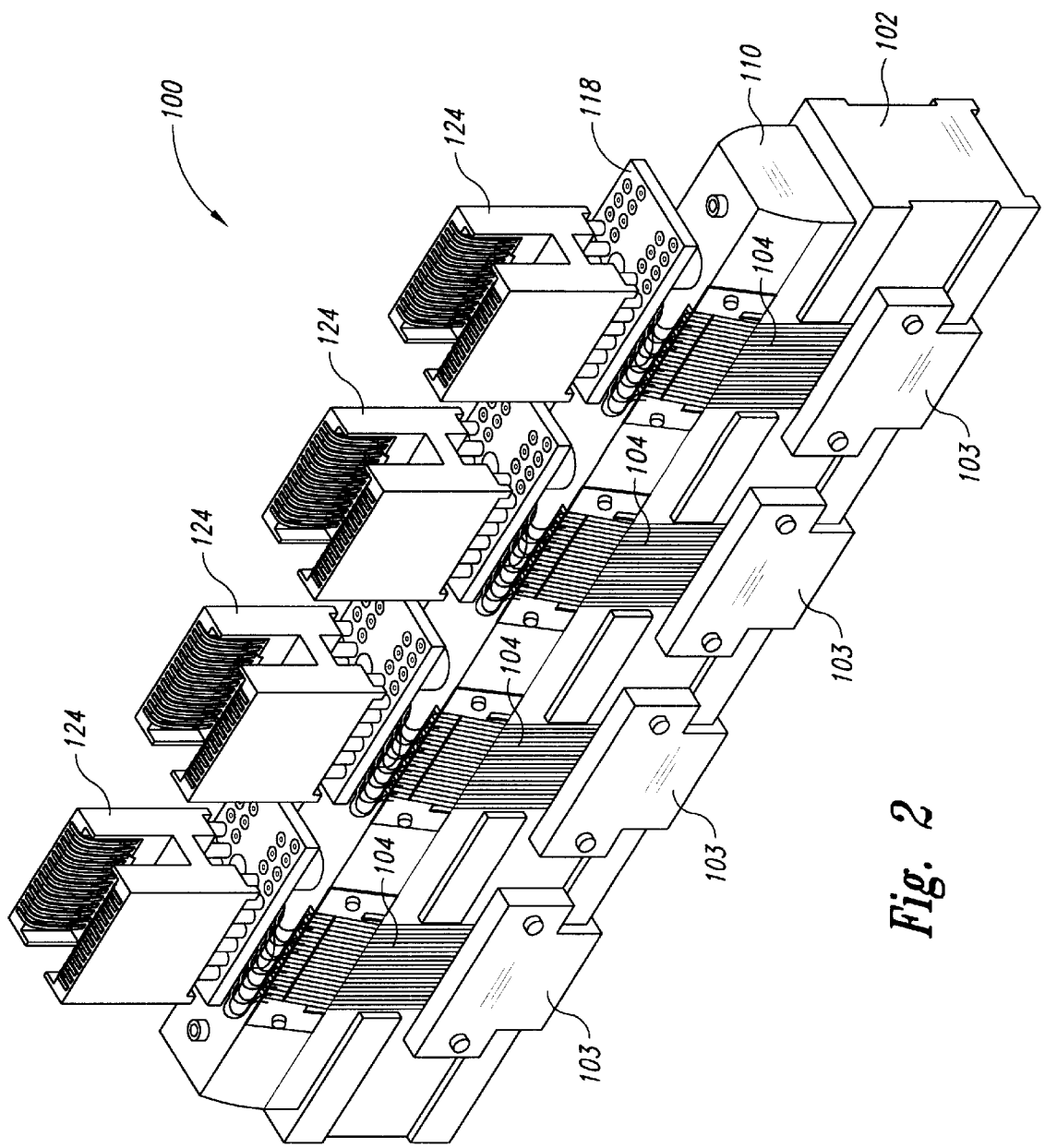
FIG. 2 is an isometric view of one embodiment of the load board socket adapter.
Figure 3:
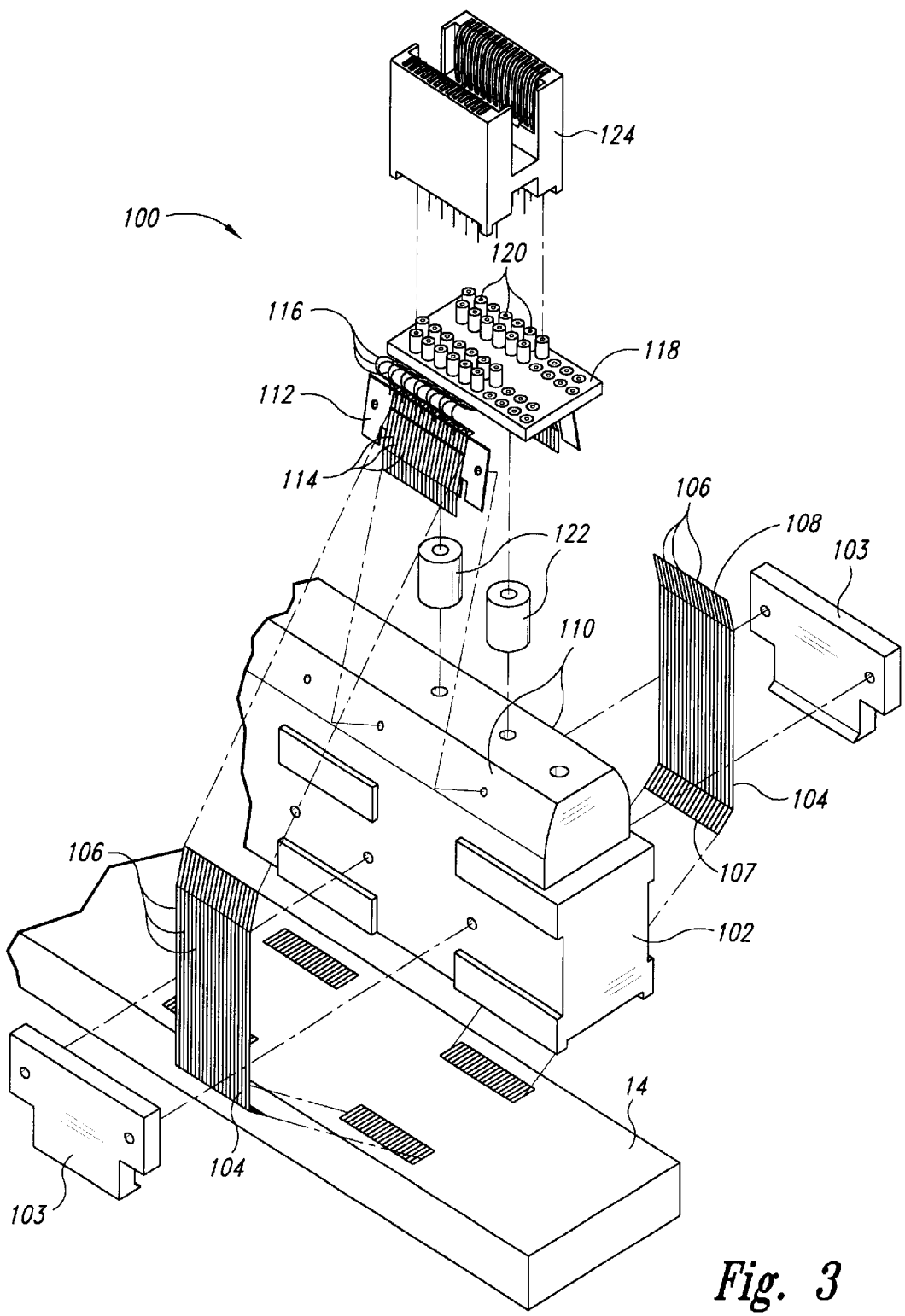
FIG. 3 is an exploded detail view of one embodiment of the load board socket adapter.
Figure 4:
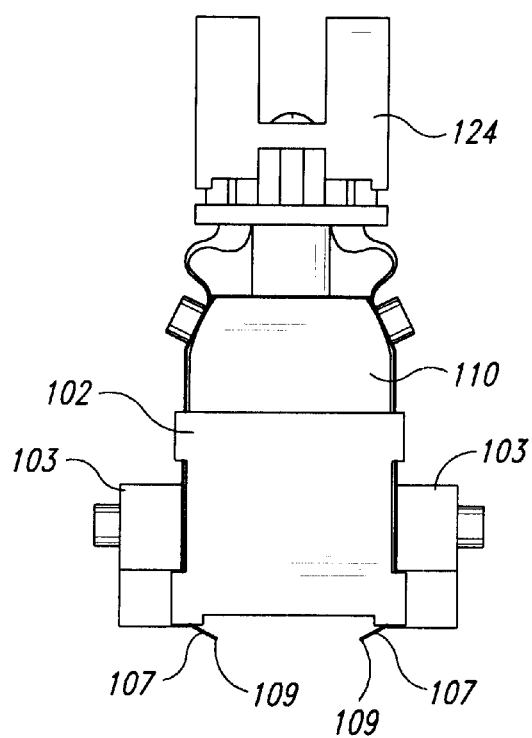
FIG. 4 is an end view of one embodiment of the load board socket adapter.
Figure 5:
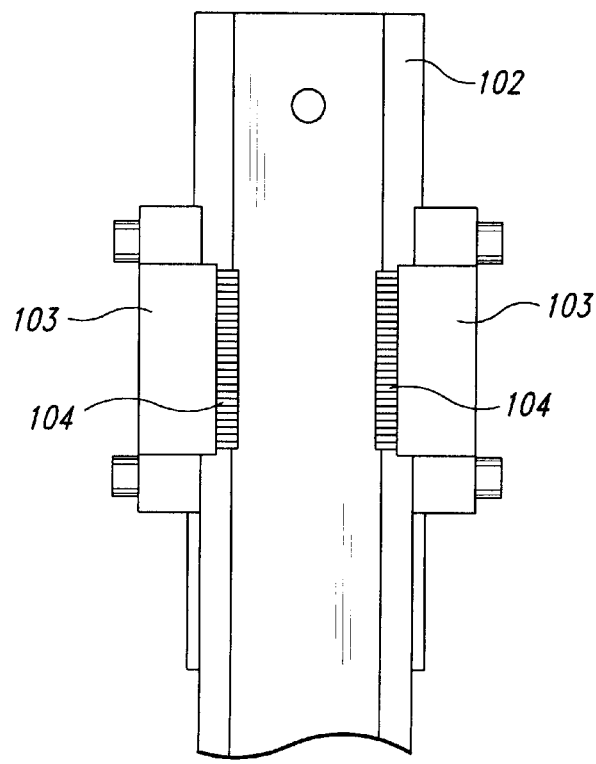
FIG. 5 is a bottom detail view of one embodiment of the load board socket adapter.

Referring in particular now to FIGS. 2–5, a load board socket adapter in accordance with the invention is shown and will be described in detail in the description which follows. The load board socket adapter is generally designated as 100 in the accompanying drawings.

Load board socket adapter 100 may have an adapter base 102 which advantageously can be manufactured from a phenolic material due to its electrical and machinability characteristics. It should be noted that other materials are suitable as well. The configuration of adapter base 102 can be adjusted or altered to attach to a variety of test fixtures. In the particular embodiment shown, the configuration is adapted to attach to both 4M×4 and 1M×4 load boards which allow a user to run tests for parts on a Megatest GII tester without the use of a corresponding handler.

A pair of first contact sets 104 are clamped or otherwise removably attached to opposing outside surfaces of adapter base 102. Here, first contact sets 104 are clamped to the sides of adapter base 102 using clamp members 103. Clamp members 103 may be attached to adapter base 102 using suitable screws or the like. First contact sets 104 may be constructed from a plurality of elongated resilient contacts 106, secured together in parallel spaced relation by an elastomeric or similar pliable material jacket. For most, if not all, applications it is desirable that each elongated resilient contact 106 be electrically isolated from all other electrical contacts 106 to ensure that each contact is capable of carrying an independent electrical signal. In the embodiment shown in the drawings, each electrical contact 106 includes a top angularly depending portion 108 and a bottom angularly depending portion 107. The angle of the top angularly depending portion 108 with respect to the main elongated body of each resilient contact 106 may be advantageously slightly more acute than the angle of the bezel portion 110 of adapter base 102. This feature provides that when first contact sets 104 are anchored to the sides of adapter base 102 a leaf spring action will ensure that the top angularly depending portions 108 contact the bezel surface of base bezel 110. The bottom angularly depending portions 107 of elongated resilient contacts 106 may depend angularly inward at an angle approaching 90°, but are shown here slightly more obtuse. Additionally, small flanges 109 may be formed at the distal ends of the bottom angularly depending portions 107. These flanges help ensure a point contact between elongated resilient contacts 106 and the contact portions or pads of load board 14.

A socket and printed circuit board subassembly is attached to the bezel portion 110 of adapter base 102 using a suitable removable attachment mechanism, such as screws or the like. The socket and printed circuit board subassembly here has a pair of second contact sets 112 electrically connected via wires 116 to a socket base or substrate 118, such as a printed circuit board, which in turn has pin receptacles 120 for receiving a removable socket such as removable socket 124. Socket base 118 may be secured to adapter base 102 via standoffs 122 as shown, using suitable connectors or fasteners. Here, each of the pair of second contact sets 112 are constructed from a plurality of individual contacts 114 secured together by an insulated material such as an elastomeric or similar material. Advantageously, second contact sets 112 can be sized and shaped to conform to the bezel portions of adapter base 102 or some similar surface, so long as the contacts are positioned to frictionally engage the top angularly depending portions 108 of first contact sets 104.

As is shown in the figures, several of the contact and socket assemblies may be attached to a single adapter base 102 and be positioned thereon to align with the contact sites on any particular test fixture such as load board 14.

Additionally, the number of contacts can be varied as well as the shape of adapter base 102, the configurations of first contact sets 104, the configurations of second contact sets 112 and the type of sockets 124 can be varied as well.

While there are shown and described specific embodiments of the invention, it is to be distinctly understood that this invention is not limited thereto but may be variously embodied to practice within the scope of the following claims.

I claim:

1. A method for interfacing an electrical device socket having pins to a testing apparatus, comprising:
   removably attaching a plurality of flexible, electrically conductive first contacts to a base member, the first contacts having first portions and second portions, the first portions being configured to engage corresponding electrical contacts on the testing apparatus;
   engaging the plurality of first contacts with a plurality of second contacts by frictionally engaging first sections of the second contacts with the second portions of the first contacts; and
   electrically coupling each of a plurality of pin receptacles with one of the plurality of second contacts, the pin receptacles being oriented to removably receive the pins of the electrical device socket.

2. The method of claim 1 wherein the first contacts are removably attached to the base member by clamping the first contacts to the base member.

3. The method of claim 1 wherein removably attaching the first contacts to the base comprises resiliently laying the first portions of the first contacts against a surface of the base.

4. The method of claim 1 further comprising receiving the pins of the electrical device socket in the pin receptacles.

5. The method of claim 6 further comprising removing the pins of the electrical device socket from the pin receptacles.

6. The method of claim 6 further comprising engaging the first portions of the first contacts with the corresponding electrical contacts on the testing apparatus.

7. The method of claim 6 wherein the electrical device socket comprises a damaged electrical device socket, the method further comprising replacing the damaged electrical device socket with a new socket, the new socket having pins arranged to be received in the pin receptacles.

8. The method of claim 1 wherein removably attaching the first contacts to the base comprises clamping a first set of the plurality of first contacts against a first surface of the base member and clamping a second set of the plurality of first contacts against an opposing second surface of the base member.

9. The method of claim 7 wherein the first set of first contacts is clamped against the first surface of the base member with a first clamp and the second set of first contacts is clamped against the second surface of the base member with a second clamp.

10. The method of claim 7 wherein engaging the plurality of first contacts with the plurality of second contacts comprises frictionally engaging the first sections of a first set of the plurality of second contacts with the second portions of the first set of first contacts and frictionally engaging the first sections of a second set of the plurality of second contacts with the second portions of the second set of first contacts.

11. The method of claim 1 further comprising engaging the first portions of the first contacts to the corresponding electrical contacts on the testing apparatus.

12. The method of claim 1 further comprising receiving the pins of the electrical device socket in the pin receptacles and placing a device to be tested within the electrical device socket.

13. A method for interfacing electrical device sockets to a testing apparatus, comprising:

removably attaching a plurality of flexible, electrically conductive first contacts to a base member, the first contacts having first portions and second portions, the first portions being configured to engage corresponding electrical contacts on the testing apparatus;

engaging the plurality of first contacts with a plurality of second contacts by frictionally engaging first sections of the second contacts with the second portions of the first contacts;

electrically coupling each of a plurality of pin receptacles with one of the plurality of second contacts;

electrically coupling a first electrical device socket to the second contacts by receiving pins carried by the first electrical device socket in the pin receptacles;

removing the pins of the first electrical device socket from the pin receptacles; and receiving pins carried by a new electrical device socket in the pin receptacles.

14. A method for interfacing a device to be tested to a testing apparatus, comprising:

removably attaching a plurality of flexible, electrically conductive first contacts to a base member, the first contacts having first portions and second portions, the first portions being configured to engage corresponding electrical contacts on the testing apparatus;

engaging the plurality of first contacts with a plurality of second contacts by frictionally engaging first sections of the second contacts with the second portions of the first contacts;

electrically coupling each of a plurality of pin receptacles with one of the plurality of second contacts;

receiving pins carried by an electrical device socket in the pin receptacles; and placing a device to be tested within the electrical device socket, thereby forming an electrical connection between the device to be tested and the base member.

* * * * *